United States Patent
Tsuda et al.

(10) Patent No.: US 7,034,537 B2
(45) Date of Patent: Apr. 25, 2006

(54) MRI APPARATUS CORRECTING VIBRATORY STATIC MAGNETIC FIELD FLUCTUATIONS, BY UTILIZING THE STATIC MAGNETIC FLUCTUATION ITSELF

(75) Inventors: Munetaka Tsuda, Ibaraki (JP); Hitoshi Yoshino, Chiba (JP); Hiroyuki Takeuchi, Chiba (JP); Shouichi Miyawaki, Chiba (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/471,539

(22) PCT Filed: Mar. 14, 2002

(86) PCT No.: PCT/JP02/02421

§ 371 (c)(1),
(2), (4) Date: Sep. 11, 2003

(87) PCT Pub. No.: WO02/071942

PCT Pub. Date: Sep. 19, 2002

(65) Prior Publication Data

US 2004/0113620 A1    Jun. 17, 2004

(30) Foreign Application Priority Data

Mar. 14, 2001   (JP)  ............................. 2001-072289

(51) Int. Cl.
   *G01V 3/00* (2006.01)

(52) U.S. Cl. ..................... 324/320; 324/319; 324/307

(58) Field of Classification Search ........ 324/300–322, 324/369; 335/216, 296, 297, 301
See application file for complete search history.

(56) References Cited

U.S. PATENT DOCUMENTS

| | | | | |
|---|---|---|---|---|
| 5,124,651 A | * | 6/1992 | Danby et al. | 324/318 |
| 5,194,810 A | * | 3/1993 | Breneman et al. | 324/319 |
| 5,315,276 A | * | 5/1994 | Huson et al. | 335/216 |
| 5,465,719 A | * | 11/1995 | Itagaki et al. | 600/410 |
| 5,592,090 A | * | 1/1997 | Pissanetzky | 324/369 |
| 5,825,187 A | * | 10/1998 | Ohashi et al. | 324/319 |
| 5,942,898 A | * | 8/1999 | Petropoulos et al. | 324/318 |
| 5,990,681 A | * | 11/1999 | Richard et al. | 324/318 |
| 6,023,165 A | * | 2/2000 | Damadian et al. | 335/297 |
| 6,043,653 A | * | 3/2000 | Takamori et al. | 324/309 |
| 6,208,145 B1 | * | 3/2001 | Danby et al. | 324/319 |
| 6,437,672 B1 | * | 8/2002 | Takeshima et al. | 335/216 |
| 6,504,372 B1 | * | 1/2003 | Cline | 324/319 |

(Continued)

*Primary Examiner*—Diego Gutierrez
*Assistant Examiner*—Tiffany A. Fetzner
(74) *Attorney, Agent, or Firm*—Antonelli, Terry, Stout and Kraus, LLP.

(57) ABSTRACT

An MRI apparatus having an open structure includes a static magnetic field generating magnet including magnetic field generating sources arranged above and below an imaging space and magnetic field fluctuation reducing plates arranged inside the magnet. Gradient magnetic field coils are fixed to the static magnetic field generating magnet so as to not be in contact with the magnetic field fluctuation reducing plates. When the strength of the magnetic field generated by the static magnetic field generating magnet fluctuates due to vibration of the gradient magnetic field coils or other devices during an imaging operation of the MRI apparatus, an eddy current is generated on the magnetic field fluctuation reducing plates in response to the magnetic field fluctuation components. Magnetic flux which cancels the static magnetic field fluctuation components is generated due to this eddy current, and consequently, a time-sequentially stable static magnetic field can be obtained.

27 Claims, 9 Drawing Sheets

U.S. PATENT DOCUMENTS 6,522,145 B1 * 2/2003 Damadian et al. .......... 324/318
6,617,852 B1 * 9/2003 Danby et al. ............... 324/318
6,781,492 B1 * 8/2004 Takeshima et al. ......... 335/216
2004/0113620 A1 * 6/2004 Tsuda et al. ................ 324/320

* cited by examiner

MRI APPARATUS CORRECTING VIBRATORY STATIC MAGNETIC FIELD FLUCTUATIONS, BY UTILIZING THE STATIC MAGNETIC FLUCTUATION ITSELF

TECHNICAL FIELD

The present invention relates to a magnetic resonance imaging (hereinafter referred to as MRI) apparatus; and, more particularly, the invention relates to an MRI apparatus and a static magnetic field generating device for use therein, in which an open-type magnet, which will not give an oppressive feeling to an object to be examined, is employed, and in which the magnetic field stability in the examination space during operation of the apparatus is improved.

BACKGROUND OF THE INVENTION

An MRI apparatus for obtaining a tomogram of a human body utilizing the nuclear magnetic resonance (NMR) phenomenon is used widely as a means for performing a diagnostic medical procedure. The MRI apparatus requires a static magnetic field generating device for generating a static magnetic field having a uniform magnetic field strength in the space where an object to be examined is inserted (hereinafter referred to as an examination space or imaging space) so as to accurately show an image of the inside structure of an examined portion of the object.

Since a uniform static magnetic field can be obtained within a solenoid coil having an infinite length, many of the static magnetic field generating devices used in an MRI apparatus employ a magnet structure, including a solenoid coil having a long, narrow cylindrical shape for generating a magnetic field with high strength and high uniformity in a space having a predetermined size, and a shim mechanism for further improving the magnetic field stability of the static magnetic field generated by the solenoid coil.

In an MRI apparatus that performs an examination on an object that is inserted in the long space within the cylindrical coil, the object is supported in the narrow examination space and is surrounded by the cylindrical coil around his/her body for a long time during examination. Therefore, the object has an oppressive feeling of being confined by the cylindrical coil, and, in some cases, the examination cannot be performed using an MRI apparatus having such a cylindrical coil on a person who has claustrophobia, on a baby, and the like, who cannot stand such an oppressive feeling.

Consequently, there has been developed in recent years an MRI apparatus including a static magnetic field generating device having a relatively low magnetic field strength, which employs a gantry structure in which the examination space is left open by providing an opening on the sides of the static magnetic field generating device, or a gantry structure in which the area in which the object is to be inserted, provided in front of the static magnetic field generating device, is widely opened.

The MRI apparatus having a open structure includes a permanent magnet or a resistive magnet as a magnet for generating the magnetic field. In the MRI apparatus using a permanent magnet or a resistive magnet, the S/N ratio of the image obtained in a high-speed mode is deteriorated in comparison with the MRI apparatus using a tunnel-shaped superconductive magnet. Also, it is not suitable for performing measurement of high-level functions, such as spectroscopic imaging and brain-function measurement.

Therefore, an MRI apparatus with an open magnet structure and including superconductive coils is being developed.

The techniques mentioned in Japanese Patent Laid-open Publication JP 10-179546, JP 11-156831, and JP 11-197132 are examples thereof.

The above-mentioned open magnet including a superconductive coil can generate a magnetic field of 1.0-tesla magnetic field strength, which is five times the strength of the magnetic field generated by a conventional magnet using a permanent magnet or a resistive coil. If a fivefold magnetic field strength can be obtained, a fivefold NMR-signal strength can be obtained as well, whereby a S/N ratio that is sufficient even for high-speed imaging in real-time or the like can be achieved.

To open up the examination space of the magnetic field generating device containing the superconductive coils, as described above, a conventional superconductive coil with a tunnel shape is divided into two coils, the thus-divided coils are contained respectively in cryostats, and these cryostats are arranged opposite to each other with respect to the examination space.

However, it was revealed in the process of the inventor's developing a superconductive open-type MRI apparatus that, in a magnetic field generating device having the above-described structure, the superconductive coils contained in the cryostats are easily affected by vibration. That is, since the coil is contained in the cryostat as a unit in the magnetic field generating device including the conventional tunnel-shaped superconductive coil, the magnetic field generating device and the coil will vibrate as a unit when vibration is generated, whereby the position of the uniform magnetic field might shift slightly but the magnetic field strength is not affected critically. However, in the open-type magnet construction, the respective superconductive coils that are arranged opposite to each other for generating a static magnetic field vibrate differently, and it has been found that this difference in the respective vibrations causes the strength of the uniform magnetic field to fluctuate in some cases.

The reasons why the superconductive coils vibrate include induced vibrations from the surroundings of the magnet, vibration brought about by gradient magnetic field generating means driven in a pulsed manner, sound propagation due to vibration of the gradient magnetic field coils, and devices themselves that generate a vibration, such as the vibration of a helium refrigerator. Such vibrations cause the cryostats to vibrate, and, in turn, the vibrations propagate to the superconductive coils. Among those reasons for the vibration of the superconductive coils, the helium refrigerator and the gradient magnetic field generating means are a cause of transmission of vibrations to the cryostats in response to their operation. Another reason for vibration of the superconductive coils is that an electromagnetic force is exerted on the conductors of the gradient magnetic field coils when current is applied to the gradient magnetic field coils, and, in reaction, an electromagnetic force is exerted on the core of the superconductive coils.

Besides, the gradient magnetic field coils and the helium refrigerator operate periodically, causing fluctuation of the static magnetic field generated by the superconductive coils. If the width of such periodic vibration is small, its effect on the image can be disregarded. However, when the width increases to some extent, the fluctuation of the static magnetic field fluctuation cannot be disregarded, and it causes artifacts on the image and deteriorates the image quality.

That is, when the magnetic field fluctuates at regular time intervals ($\omega$), measured NMR signals are modulated with a vibration frequency $f$ ($=1/\omega$). If the modulated signals are Fourier-transformed and converted into an image or spectrum, artifacts appear at positions, in real space where the vibration frequency f is reflected, that are spaced from the image. Even if the magnetic field fluctuation is slight, the fluctuation causes clear artifacts on the image and a pseudo-peak on the spectrum because of the regularity of the fluctuation.

Techniques for reducing vibration due to the helium refrigerator and the gradient magnetic field coils are described in U.S. Pat. No. 5,363,077 and in Japanese Patent Application No. 2000-203695. In those techniques, a mechanical deflection structure (spring) is inserted between a fixed body and a vibrated body, and the vibration energy of the vibrated body is absorbed by fixing the vibrated body to an object having a large mass (fixed body). On the other hand, there is a method of actively correcting magnetic field fluctuation components. For example, in the method described in U.S. Pat. No. 5,952,734 the components of the magnetic field error due to vibration are detected and the magnetic field correcting means is drive-controlled by a feedback loop. Further, the present inventors have proposed a technique of controlling magnetic field correcting means so as to accurately generate a correcting magnetic field which eliminates the detection error components generated by magnetic field fluctuation due to specific periodic mechanical vibration, such as vibration of the helium refrigerator (Japanese Patent Application 2000-34027.) This technique is very effective in reducing magnetic field fluctuation due to periodic vibration.

However, the above-described technique cannot compensate for the fluctuation of the static magnetic field due to resonance of the superconductive coils and/or its supporting mechanism. According to the inventors' research, it was found that the superconductive coils within an open-type static magnetic field generating device are periodically vibrated not only by mechanical vibration of the gradient magnetic field coils, but also the whole or a part of the divided structure of the superconductive coils is vibrated due to an electromagnetic force exerted on the superconductive coils by application of current to the gradient magnetic field coil in cycles of a specific value. Particularly, it has been found that the vibration width greatly changes when the superconductive coils and/or its supporting mechanism resonate with this vibration. Further, it was also found that the static magnetic field strength is fluctuated as this width increases.

The magnetic field fluctuation due to resonance of the superconductive coils cannot be disregarded since, in recent years, large energy is applied to the gradient magnetic field generating means in a short time period in new fast imaging methods, such as the fast spin echo (FSE) method and the echo planar method that have come to be frequently used. In these methods, the mechanical vibration period greatly changes because the vibration energy of the gradient magnetic field generating means is dramatically increased and the parameter setting range of the imaging conditions is expanded.

The present invention has been made in consideration of the above-described viewpoints, and a first object of the present invention is to provide an MRI apparatus that can achieve an improved reliability in obtaining an examination result by substantially canceling the static magnetic field fluctuation due to vibration of the open-type MRI apparatus without supplying energy from the outside.

A second object of the present invention is to provide a technique that is effective in substantially reducing or canceling fluctuation of the static magnetic field strength that is generated due to vibration of the open-type superconductive coil.

A third object of the present invention is to provide an MRI apparatus that can produce an image having a good image quality that is suitable for a doctor's diagnosis, on which artifacts are not generated, even if the open-type static magnetic field generating device is vibrated.

A fourth object of the present invention is to provide an open-type MRI apparatus that is able to maintain stability of the static magnetic field strength with a simple static magnetic field fluctuation reduction mechanism.

A fifth object of the present invention is to provide an open-type MRI apparatus in which a wide imaging space is established even when the static magnetic field fluctuation reduction mechanism is provided.

A sixth object of the present invention is to provide an open-type MRI apparatus in which a wide imaging space is established even when both a passive-shimming mechanism for improving the uniformity of the static magnetic field and a static magnetic field fluctuation reduction mechanism are provided.

A seventh object of the present invention is to provide a static magnetic field generating device by which the above-described first to sixth objects are achieved when the device applied to an MRI apparatus.

SUMMARY OF THE INVENTION

Conventionally, engineers engaged in the field of MRI apparatus development have taken for granted the fact that a member that generates eddy currents is not provided in the vicinity of a gradient magnetic field generating means, including a static magnetic field generating means, so as to suppress to the utmost the generation of eddy currents due to gradient magnetic fields generated by the gradient magnetic field generating means. The reason for this is that, if a member that generates an eddy current is provided in the vicinity of the gradient magnetic field generating means, an eddy current is generated by the eddy current generating member provided in the vicinity of the gradient magnetic field generating means when current is applied in pulses to the gradient magnetic field generating means, whereby the eddy current adversely affects the strength waveform of the gradient magnetic fields.

However, the effect of the eddy current generated due to the gradient magnetic fields can be eliminated by variably controlling the value of the current supplied to the gradient magnetic field generating means. Therefore, in accordance with the present invention, the eddy current generating member is deliberately provided in the vicinity of the gradient magnetic field generating means, thereby utilizing the eddy current generated on the eddy current generating member caused by the static magnetic field fluctuation due to vibration of the superconductive coils so as to substantially cancel the fluctuation of the magnetic field caused by vibration and resonance. In this manner, in the MRI apparatus according to the present invention, the strength of the static magnetic field generated in the examination space is extremely stably maintained.

To achieve the above-stated objects, the present invention provides an MRI apparatus including static magnetic field generating means for generating a static magnetic field with a predetermined strength in an imaging space having a sufficient size to accommodate an object to be examined and gradient magnetic field coils for generating magnetic field strength gradients in the space, the MRI apparatus further including magnetic field fluctuation reducing means which, when the static magnetic field fluctuates, generates a magnetic flux utilizing that magnetic field fluctuation so as to substantially maintain the predetermined static magnetic field strength, without supplying energy from the outside.

Further, an MRI apparatus according to the present invention includes static magnetic field generating means for generating a static magnetic field with a predetermined strength in the imaging space having a size where an object can be inserted; gradient magnetic field coils for generating magnetic field strength gradients in the space; and magnetic field fluctuation reducing means for substantially canceling fluctuation components of magnetic field strength generated by the static magnetic field generating means, which comprises conductive members that generate a magnetic flux which substantially cancels the fluctuation of the static magnetic field strength by generating an eddy current in response to the fluctuation of the static magnetic field strength.

It is desirable that the static magnetic field generating means has a pair of static magnetic field generating sources that are arranged opposite to each other relative to the imaging space, and the magnetic field fluctuation reducing means is preferably provided close to at least one of the static magnetic field generating sources. The magnetic field fluctuation reducing means also may be provided close to both of the static magnetic field generating sources.

The present invention can be applied to an MRI apparatus having the pair of the static magnetic field generating sources constituted of superconductive coils or resistive coils.

The material of the conductive members is preferably aluminum, copper, or silver having nonmagnetic characteristics.

The conductive members desirably have a flat-plate shape and are arranged so as to cross the magnetic flux direction in the imaging space.

Further, it is preferable that the pair of static magnetic field generating sources is constituted of superconductive coils, and the conductive members have a flat-plate shape, with a size that can cover the imaging space, and are arranged so as to cross the flux direction in the imaging space.

Further, the magnetic field fluctuation reducing means is preferably arranged parallel to the surfaces of the static magnetic field generating sources and close to those surfaces facing the imaging space; and, more preferably, it is in close contact with the static magnetic field generating means.

Further, the magnetic field fluctuation reducing means may be included in the static magnetic field generating means as a constituents element thereof.

The magnetic field fluctuation reducing means may be provided between the static magnetic field generating source and the gradient magnetic field coils, and it also may be provided between the static magnetic field generating device and the gradient magnetic field coils.

Further, a gap is preferably retained between the magnetic field fluctuation reducing means and the gradient magnetic field coils.

Further, to achieve the above-stated objects, the invention provides an MRI apparatus including a pair of static magnetic field generating sources that are arranged opposite to each other relative to the imaging space where an object to be examined is inserted; a magnetic circuit member provided outside the continuous space, including the pair of the static magnetic field generating sources and the imaging space, for leading respective magnetic flux generated by each of the static magnetic field generating sources to the other; nonmagnetic conductive plates provided at positions of the respective static magnetic field generating sources close to the imaging space; and a pair of gradient magnetic field coils provided between the imaging space and the conductive plates, which are supported by supporting mechanisms and are fixed to the magnetic circuit member.

The supporting mechanism preferably includes an adjusting mechanism for arranging each gradient magnetic field coil in parallel with the surface of the static magnetic field generating source.

Further, to achieve the above-stated objects, the invention provides an MRI apparatus including a pair of static magnetic field generating sources that are arranged opposite to each other relative to the imaging space where an object to be examined is inserted; a magnetic circuit member for leading magnetic flux generated by one magnetic field source to the other, which is arranged outside the continuous space including the pair of the static magnetic field generating sources and the imaging space; nonmagnetic conductive plates provided at positions of the static magnetic field generating sources close to the imaging space; a pair of gradient magnetic field coils that are supported by and fixed to the magnetic circuit member and are arranged between the imaging space and the conductive plates; and a plurality of ferromagnetic pieces detachably provided on the conductive plates for adjusting the magnetic field uniformity of the imaging space.

It is preferable that the conductive plate has a predetermined thickness and a part of the ferromagnetic pieces is accommodated by this thickness.

Further, to achieve the above-stated objects, the invention provides an MRI apparatus, including static magnetic field generating means for generating a static magnetic field with a predetermined strength in the imaging space having a size where an object to be examined can be inserted and gradient magnetic field coils for generating magnetic field strength gradients in the space, the MRI apparatus further including magnetic field fluctuation reducing means constituted of conductive members for generating a magnetic flux that compensates for fluctuation of the static magnetic field strength, and means for correcting the effect that the magnetic flux from eddy currents generated by the magnetic field fluctuation reducing means gives to the gradient magnetic fields.

Further, to achieve the above-stated objects, the invention provides an MRI apparatus including static magnetic field generating means constituted of a pair of coils for generating a static magnetic field with a predetermined strength in the imaging space, which coils are respectively contained in vessels arranged above and below the imaging space; a magnetic circuit member for leading respective magnetic flux generated from each coil to the other coil; and magnetic field fluctuation reducing means provided on sides of the respective vessels containing the coils facing the imaging space so as to cross the magnetic flux generated by the coils, the magnetic field fluctuation reducing means for generating magnetic flux that compensates for the fluctuation of magnetic flux density by generating a compensatory magnetic flux.

The coil may be a superconductive coil or a resistive coil.

In this static magnetic field generating device for the MRI apparatus, it is desirable that the magnetic field fluctuation reducing means is provided as flat conductive plates and is made of aluminum, copper, or silver consisting of a nonmagnetic material.

Further, to achieve the above-stated objects, the invention provides an MRI apparatus including static magnetic field generating means constituted of a pair of coils for generating a static magnetic field with a predetermined strength in the imaging space, which coils are respectively contained in vessels provided above and below the imaging space; a magnetic circuit member for leading respective magnetic flux generated by one coil to the other coil, arranged outside the area including the imaging space and the pair of vessels; conductive plates provided on sides of the respective vessels containing the coils facing the imaging space so as to cross the magnetic flux generated by the coils, the conductive plates generating a compensatory magnetic flux that substantially cancels fluctuation of the magnetic flux; and a plurality of ferromagnetic pieces arranged so as to adjust the uniformity of the magnetic field generated by the coils in the imaging space, a part of the pieces being accommodated in the conductive plates.

BEST MODE FOR CARRYING OUT THE INVENTION

Hereinafter, various embodiments of the present invention will be described with reference to the drawings.

Figure 1:
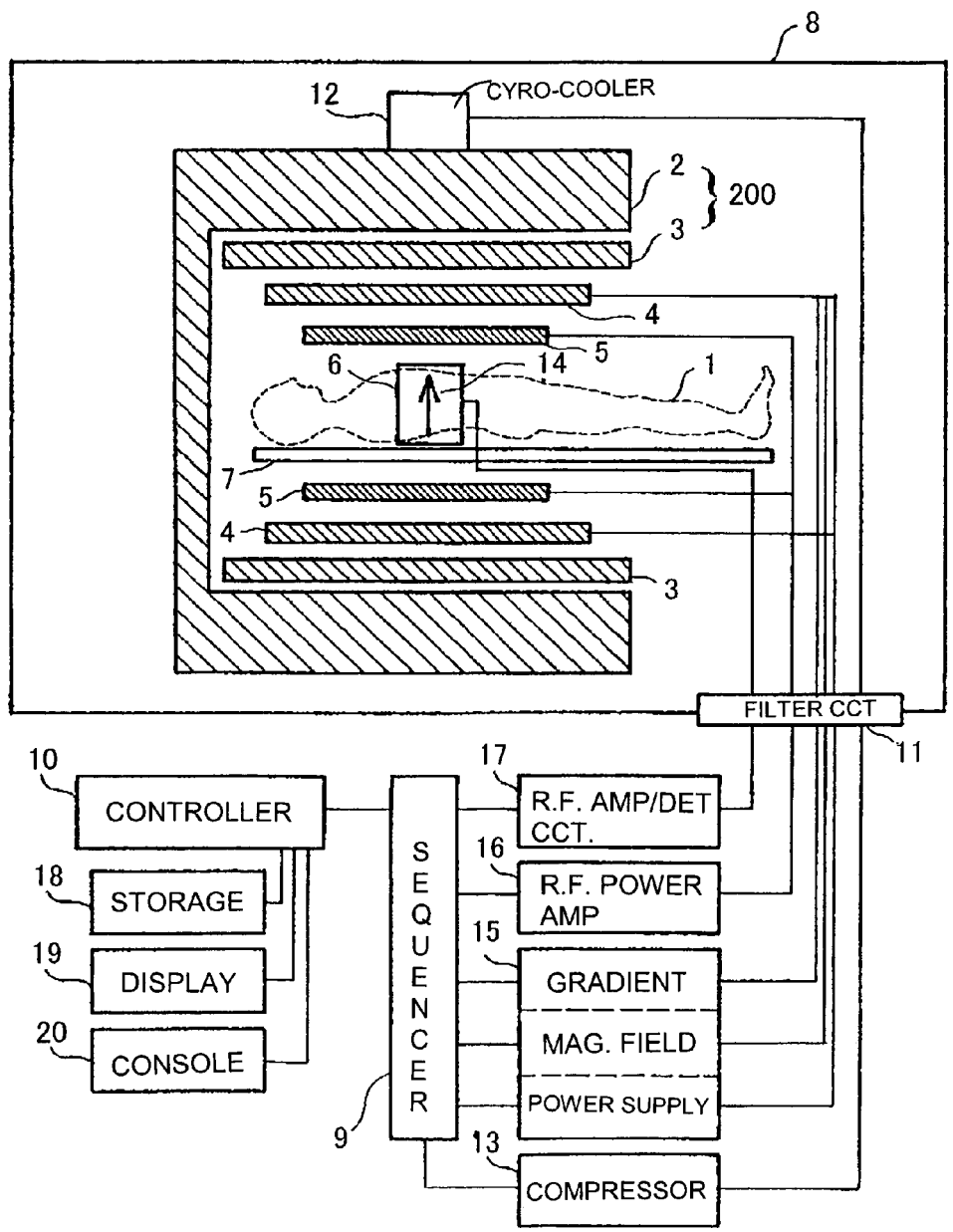
FIG. 1 is a block diagram showing the overall structure of an MRI apparatus according to the invention.

FIG. 1 is a diagram showing the overall structure of an MRI apparatus according to the invention. This MRI apparatus includes a static magnetic field generating device 200 constituted of a static magnetic field generating magnet 2 to which a pair of magnetic field generating sources are provided above and below a space (measurement space) where an object 1 to be examined is inserted, and magnetic field fluctuation reducing plates 3 provided close to the respective magnetic field generating sources facing the measurement space; gradient magnetic field coils 4 arranged still closer to the measurement space than the magnetic field fluctuation reducing plates 3; radio-frequency coils 5 arranged still closer to the measurement space than the gradient magnetic field coils 4; and a detecting coil 6 for detecting NMR signals generated from the object 1.

The magnetic field fluctuation reducing plates 3, the gradient magnetic field coils 4, and the radio-frequency coils 5 all have a flat shape and consist of respective pairs of coils aligned with the open structure of the static magnetic field generating magnet 2. A table 7 is also provided for supporting and transferring the object 1 to a location where his/her examined portion will be at the center of the static magnetic field generating magnet 2. The gantry unit and the table unit of the MRI apparatus having the above-described structure are installed in an examination room provided with an electromagnetic-wave shield 8 for the purpose of preventing outside electromagnetic-wave noise from mixing with the NMR signals.

This MRI apparatus further includes a power source and a circuit for driving each of the above-described coils; a sequencer 9 for controlling the operation timing of the power source and the circuit; and a controller 10 for controlling the operation of the apparatus and for processing the NMR signals so as to create an image or spectrum. These elements are provided outside the examination room, and they are connected to each coil through a filter circuit 11, for the purpose of avoiding interference by electromagnetic-wave noise.

In this embodiment, superconductive coils are employed as the magnetic field generating source of the static magnetic field generating magnet 2, which coils are contained in cryostats filled with a coolant, such as liquid helium. In order to reduce the evaporation of the liquid helium, a cryo cooler 12 and a compressor 13, for driving the cryo cooler 12, are provided.

The magnetic field generated by the static magnetic field generating magnet 2 is directed from the floor toward the ceiling, as shown by the arrow 14 in FIG. 1, and its magnetic field strength is constantly kept at 0.7 tesla, for example. Further, in this embodiment, both a passive-shimming mechanism and an active-shimming mechanism are installed, the active-shimming coil generating a correcting magnetic field by supplying current to a shimming coil provided within the gradient magnetic field coils 5. The passive-shimming mechanism and the active-shimming mechanism will be described in more detail later. The static magnetic field uniformity within the imaging space is adjusted to have a high uniformity, at 3 ppm or less, for example, by these shimming mechanisms.

The magnetic field fluctuation reducing plates 3 are fixed along the surface of cryostats 203 and 204 facing the measurement space. The magnetic field fluctuation reducing plates 3 are designed to reduce and substantially cancel any magnetic field fluctuation generated due to vibration of the static magnetic field generating magnet 2 without applying energy from the outside, by generating an eddy current on the magnetic field fluctuation reducing plates 3, which in turn creates a magnetic flux that cancels the magnetic field fluctuation. Consequently, the magnetic field fluctuation reducing plates 3 are made of conductive members that generate an eddy current actively and efficiently. The arrangement and structure of the magnetic field fluctuation reducing plates 3 will be described in more detail later.

The gradient magnetic field coils 4 consist of three pairs of gradient magnetic field coils wound respectively in x-, y-, and z-directions that are perpendicular to one another so as to change the magnetic flux density depending on the position within the measurement space. Each pair of the gradient magnetic field coils is arranged one above and one below the measurement space. The separated coils of these three pairs are formed into two units, arranged above and below the imaging space. Incidentally, the gradient magnetic field coils 4 of a known active-shield type are used.

The gradient magnetic field coils 4 are fixed to the static magnetic field generating magnet 2 through a gap between the magnetic field fluctuation reducing plates 3 and the gradient magnetic field coils 4, such that the magnetic field fluctuation reducing plates 3 do not directly contact the gradient magnetic field coils 4, so as not to transmit vibrations generated due to the driving of the gradient magnetic field coils 4 to the magnetic field fluctuation reducing plates 3. The fixing structure thereof also will be described later.

The three pairs of the gradient magnetic field coils are connected respectively to a gradient magnetic field power source 15. When the imaging sequence is activated, the gradient magnetic field power source 15 is driven by a control signal from a sequencer 9. The gradient magnetic fields are applied to the object 1 when current is supplied to the gradient magnetic field coils 4 at a predetermined timing of the imaging sequence from the gradient magnetic field power source 15. These gradient magnetic fields are applied for the purpose of setting the position of an imaging plane on the object 1 and for providing spatial positional information to NMR signals acquired from the examined portion of the object 1. Further, the gradient magnetic field coils 4 are provided with a plurality of shimming coils for generating correcting magnetic fields, such as z2 and y2, for the above-mentioned active shimming. The driving power source of the shimming coils is also connected to a shim power source (not shown) through the filter circuit 11.

The radio-frequency coils 5 are connected to a radio-frequency power amplifier for supplying radio frequency current thereto, and they generate a radio-frequency magnetic field for generating nuclear magnetic resonance in atomic nuclei (Hydrogen nucleus $^1H$ is usually used) in the examined portion of the object 1. The radio-frequency power amplifier 16 is also controlled by the control signal from the sequencer 9.

The detecting coil 6 is connected to a radio-frequency amplification/detection circuit 17, and it detects NMR signals generated from the object 1. The radio-frequency amplification/detection circuit 17 amplifies and detects the NMR signals detected by the detecting coil 6, and it converts them into digital signals that can be processed by the controller 10. The operation timing of the radio-frequency amplification/detection circuit 17 is also controlled by the sequencer 9.

The controller 10 performs calculations, such as image reconstruction, spectral calculation, and the like, using NMR signals that are converted into digital signals. Further, the controller 10 controls the operation of each unit of the MRI apparatus through the sequencer 9. The controller 10 is also connected to a storing device 18 for storing data, a display device 19 for displaying the processed data, and a console 20 from which an operator inputs examination conditions.

Figure 2:
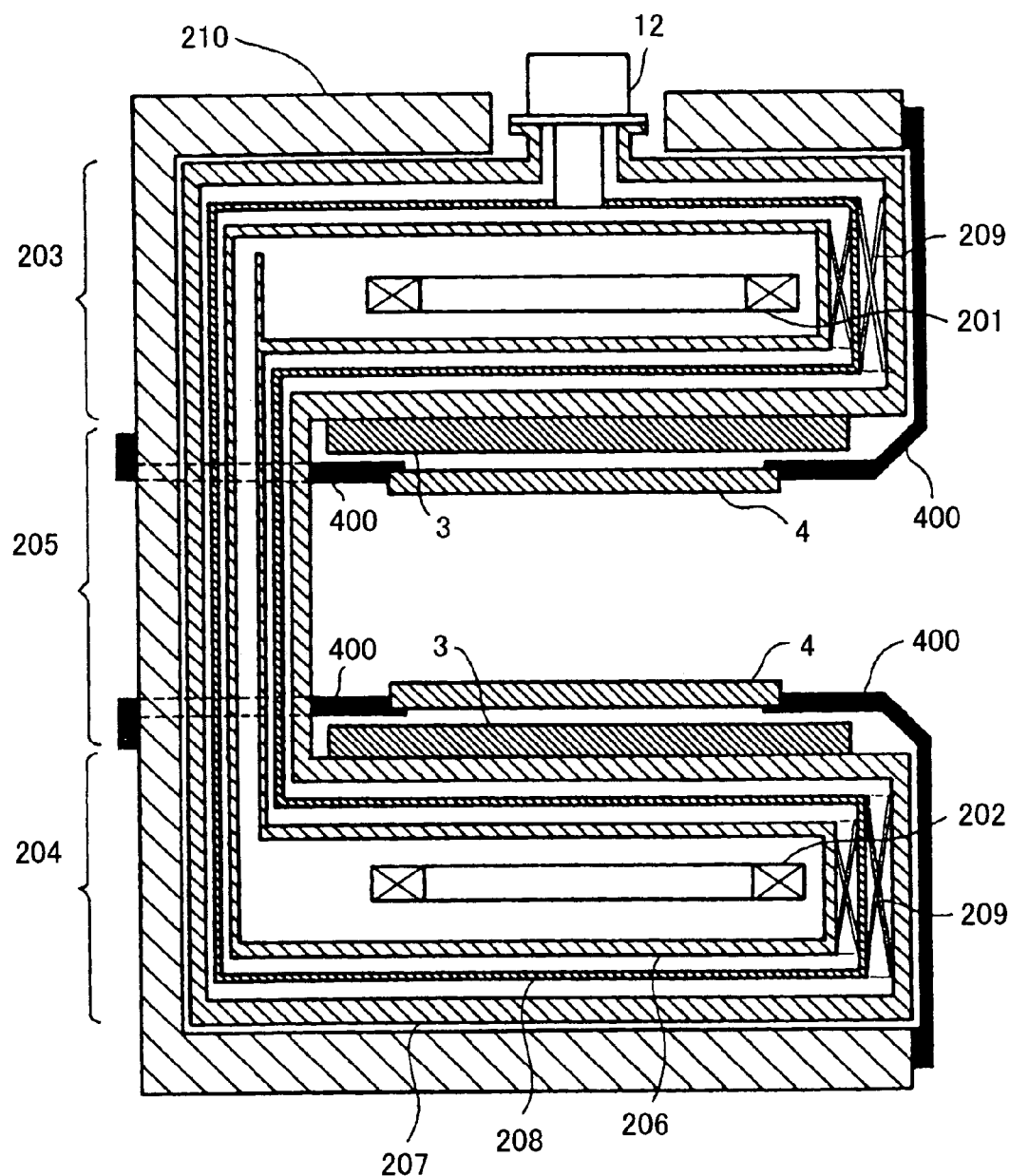
FIG. 2 is a cross-sectional view showing one embodiment of an MRI apparatus according to the invention.

Next, the structure of the magnetic field fluctuation reducing plates 3 and the gradient magnetic field coils 4 will be described with reference to FIG. 2. FIG. 2 is a cross-sectional view showing the inside structure of the static magnetic field generating coil 2 shown in FIG. 1. Also, FIG. 2 shows the combination of the magnetic field fluctuation reducing plates 3 and the gradient magnetic field coils 4.

The static magnetic field generating magnet 2, according to this embodiment, is basically constituted of an upper cryostat 203 containing an upper superconductive coil 201, a lower cryostat 204 containing a lower superconductive coil 202, and a connecting tube 205 for connecting the upper and lower cryostats 203 and 204. Although one superconductive coil is contained in each of the upper and lower cryostats in FIG. 2, a plurality of superconductive coils may be provided for improving the magnetic field uniformity in the measurement space and for reducing the distribution of magnetic field leakage.

Inside the upper and lower cryostats 203 and 204, there is provided a helium tank 206 filled with liquid helium. The upper superconductive coil 201 and the lower superconductive coil 202 contained in the upper and lower cryostats 203 and 204, respectively, are refrigerated by helium and their temperature is kept at 4.2° Kelvin temperature, whereby these superconductive coils are maintained in a stable superconducting state. A vacuum chamber 207 is provided at the outermost portion of the upper and lower cryostats 203 and 204 and the cryostat connecting tube 205, and the gap between the vacuum chamber 207 and the helium tank 206 is kept in vacuum. The vacuum chamber 207 and the helium tank 206 are made of stainless steel having a thickness that can withstand atmospheric pressure and the expected electromagnetic force.

Between the vacuum chamber 207 and the helium tank 206, there is provided a heat shield 208 that is thermally combined with the cryo-cooler 12. The heat shield 208 is made of an aluminum thin plate, which is refrigerated at 20° Kelvin temperature, for example. The heat shield 208 that is refrigerated at a low temperature prevents heat from passing from the vacuum chamber 207 to the helium tank 206, and, by thus preventing such heat conduction, the evaporation of liquid helium is also suppressed. Although FIG. 2 shows a one-layer heat shield, a double-layer heat shield constituted of a heat shield refrigerated at 70° Kelvin temperature and a heat shield refrigerated at 20° Kelvin temperature, or a triple-layer heat shield, also may be employed.

The vacuum chamber 207, the heat shield 208, and the helium tank 206 are mutually fixed in position by thin supporting bars 209 made of stainless steel and having small heat conductivity, so as to reduce to the utmost the amount of liquid helium evaporation due to heat conduction.

In the static magnetic field generating magnet 2, an iron shield 210 is provided above the upper cryostat 203, below the lower cryostat 204, and at the rear of the cryostat connecting tube 205, that is, at the rear of the measurement space. By providing the iron shield 210, a magnetic circuit is formed and the space of magnetic field leakage distribution is reduced. The space of magnetic field leakage distribution is usually defined by the positions of 0.5-millitesla magnetic flux density. By forming such a magnetic circuit, the magnetic field leakage distribution space can be kept within an installation room of about 6 m×8 m, which is similar to that in the conventional apparatus, even in the open-type magnet structure with a high magnetic field according to this embodiment.

As described above, the magnetic field fluctuation reducing plates 3 are designed to actively generate an eddy current in response to the magnetic field fluctuation of the uniform magnetic field. Consequently, the material of the magnetic field fluctuation reducing plates 3 is a nonmagnetic material with a low electrical resistance. Aluminum (pure aluminum), copper, or silver can be used as such a conductive material. Which material to use may be determined in consideration of the electric properties, magnetic properties, cost, obtainability, and workability of each material. To trap the magnetic flux generated in the direction of the arrow 14 shown in FIG. 1 and to trap the magnetic flux forming the uniform magnetic field in the imaging space, the magnetic field fluctuation reducing plates 3 have the form of a flat-plate that are arranged perpendicular to the lines of magnetic flux. The magnetic field fluctuation reducing plates 3 need to have a size that can cover at least the imaging space; and, more preferably, they have the same outer diameter as that of the superconductive coils 201 and 202, or larger. For obtaining a low electrical resistance, the thickness of the magnetic field fluctuation reducing plates 3 is preferably large, between 1 mm and 20 mm, for example. Further, the conductive material does not need to be a single-thickness material, and it may be constructed by laminating several plates that are made of a predetermined material. However, since the imaging space is narrowed as the thickness is increased, the size of the imaging space is preferably given consideration in choosing the thickness of these plates.

Figure 3:
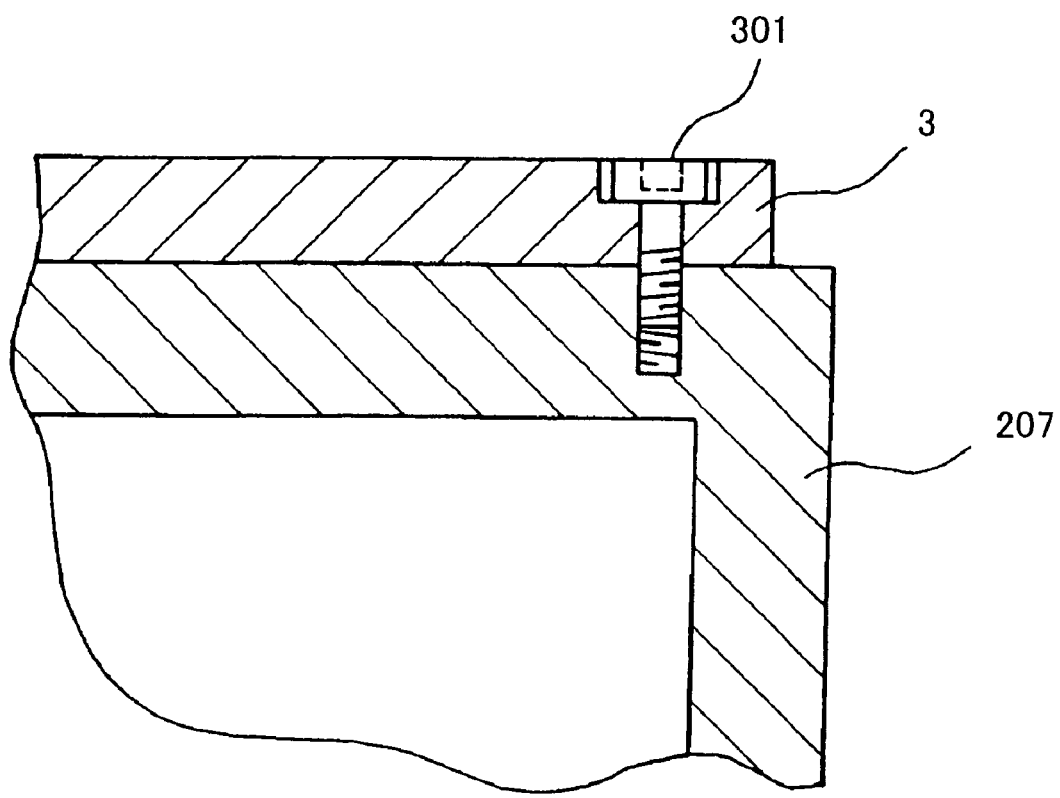
FIG. 3 is a sectional view showing the manner of fixing the magnetic field fluctuation reducing plate in the MRI apparatus shown in FIG. 2.

In this embodiment, the magnetic field fluctuation reducing plates 3 are constituted of thick flat plates of pure aluminum, and they are joined and fixed firmly by adhesion bond or screws along the surface of the vacuum chamber of the upper cryostat 203 and the lower cryostat 204, on the sides of the vacuum chamber facing the space where the object is inserted. FIG. 3 shows the manner of mounting thereof.

On the magnetic field fluctuation reducing plates 3, an eddy current is generated due to magnetic variation of the magnetic field generated by the static magnetic field generating magnet, as well as an eddy current due to a magnetic variation occurring when the gradient magnetic field coils 4 are driven. These eddy currents apply a complex force on the static magnetic field fluctuation reducing plates 3. On the other hand, the position of the magnetic field fluctuation reducing plates 3 needs to be stable so as to cancel the fluctuations in the magnetic field of the static magnetic field magnet. Consequently, in this embodiment a plurality of portions of the magnetic field fluctuation reducing plate 3 in its circumferential direction are fixed by bolts 301 to the corner section of the vacuum chamber 207, which has a large strength. In this manner, the mechanical flexibility is suppressed to the utmost.

Figure 4:
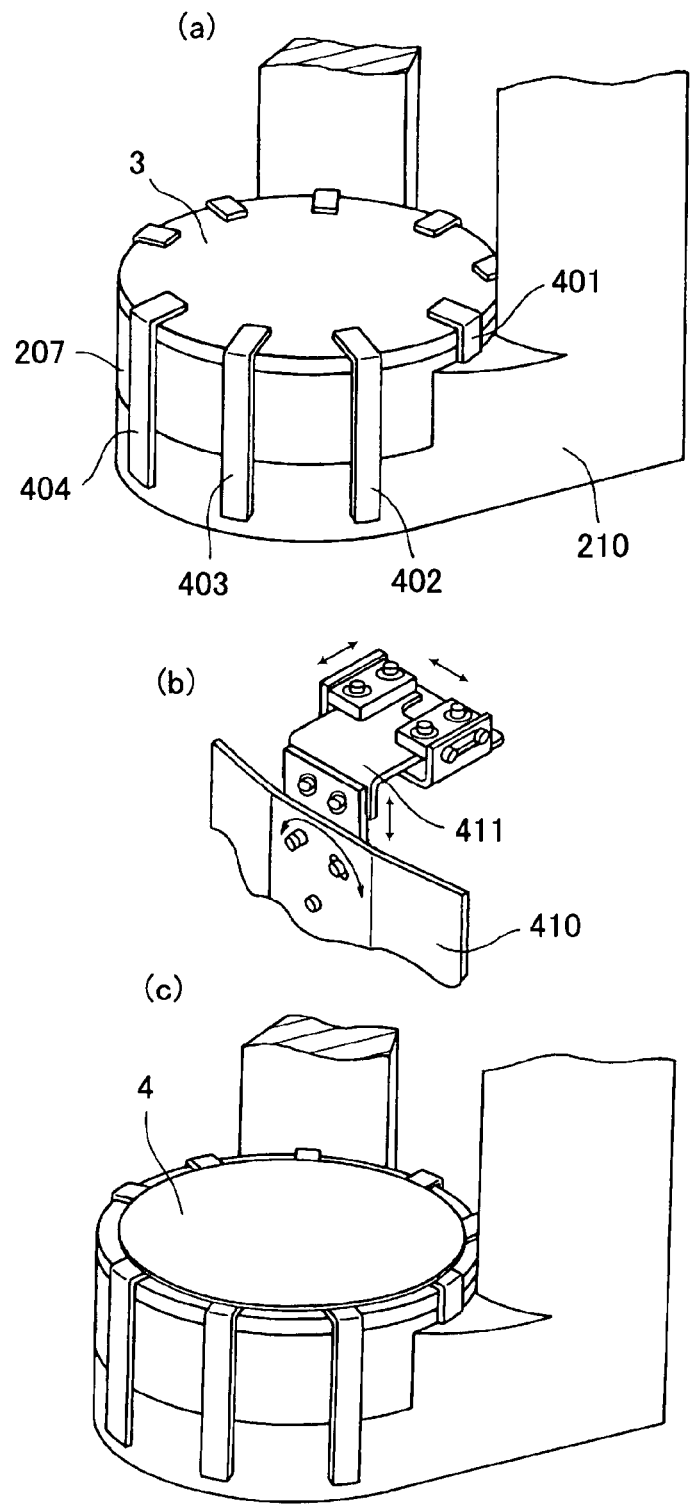
FIG. 4(a) is a perspective view showing the lower cryostat prior to installation of a gradient magnetic field coil in the MRI apparatus shown in FIG. 2.
FIG. 4(b) is a perspective view showing the supporting attachment for the gradient magnetic field coil.
FIG. 4(c) is a perspective view of the lower cryostat after installation of the gradient magnetic field coil.

The gradient magnetic field coils 4 are fixed to the iron shield 210 through supporting attachments 400, which are arranged so as not to directly contact the above-described upper and lower cryostats 203 and 204 and the magnetic field fluctuation reducing plates 3. FIG. 4(a) to 4(c) show the manner of attachment of the gradient magnetic field coil 4 that is installed close to the lower cryostat 204. Since the arrangement of the upper cryostat 203 is just the same, only the lower cryostat will be described below.

As shown in FIG. 4(a), a plurality of the supporting attachments 400 (401 to 404) are provided along the circumference of the vacuum chamber 207. Each of them is firmly fixed to the iron shield 210 so as not to contact the vacuum chamber 207. Among the supporting attachments, some of them, such as members 402, 403, and 404 here shown, are fixed to the lower plate of the iron shield 210, and the supporting attachment 401, which supports the gradient magnetic field coil 4 in the vicinity of the cryostat connecting tube 205, is fixed to a side plate forming one part of the iron shield 210 in the vicinity of the cryostat connecting tube 205. By thus fixing the gradient magnetic field coil 4 to the iron shield 210, the vibration energy of the gradient magnetic field coil 4 is absorbed by the iron shield 210, which has a large mass. Further, the vibration of the gradient magnetic field coil 4 is not transmitted directly to the cryostat 204 and the magnetic field fluctuation reducing plate 3.

As shown in FIG. 4(b), the supporting attachment 400 has a fixing portion 410 for fixing the supporting attachment 400 to the iron shield 210, and a horizontal portion 411 for horizontally fixing the gradient magnetic field coil 4. The horizontal portion 411 can be attached to the fixing portion 410 so as to be rotated relative to the fixing portion 410, as shown by the arc-shaped arrow in the figure. Further, on the horizontal portion 411, the positions at which the gradient magnetic field coil 4 is fixed can be adjusted in the x-, y-, and z-directions by fixing screws.

FIG. 4(c) shows the gradient magnetic field coil 4 fixed by such supporting attachments 400. By constructing the supporting attachments 400 as described above, the gradient magnetic field coil 4 can be kept horizontal and the gap between the magnetic field fluctuation reducing plate 3 and the gradient magnetic field coil 4 can be adjusted to be constant. By thus making the gap between the magnetic field fluctuation reducing plate 3 and the gradient magnetic field coil 4 uniform, the positional dependency of an eddy current generated on the magnetic field fluctuation reducing plate 3 due to the pulsing gradient magnetic field generated by the gradient magnetic field coil 4 can be eliminated to the utmost. Consequently, the eddy current generated due to the gradient magnetic fields can be highly corrected by known techniques, that is, by means of a correction method in which the waveform of the current for driving the gradient magnetic field coil 4 is adjusted or an offset magnetic field is applied. Therefore, the fluctuation in the magnetic field can be efficiently canceled utilizing the eddy current generated due to the static magnetic field according to the invention.

Figure 5:
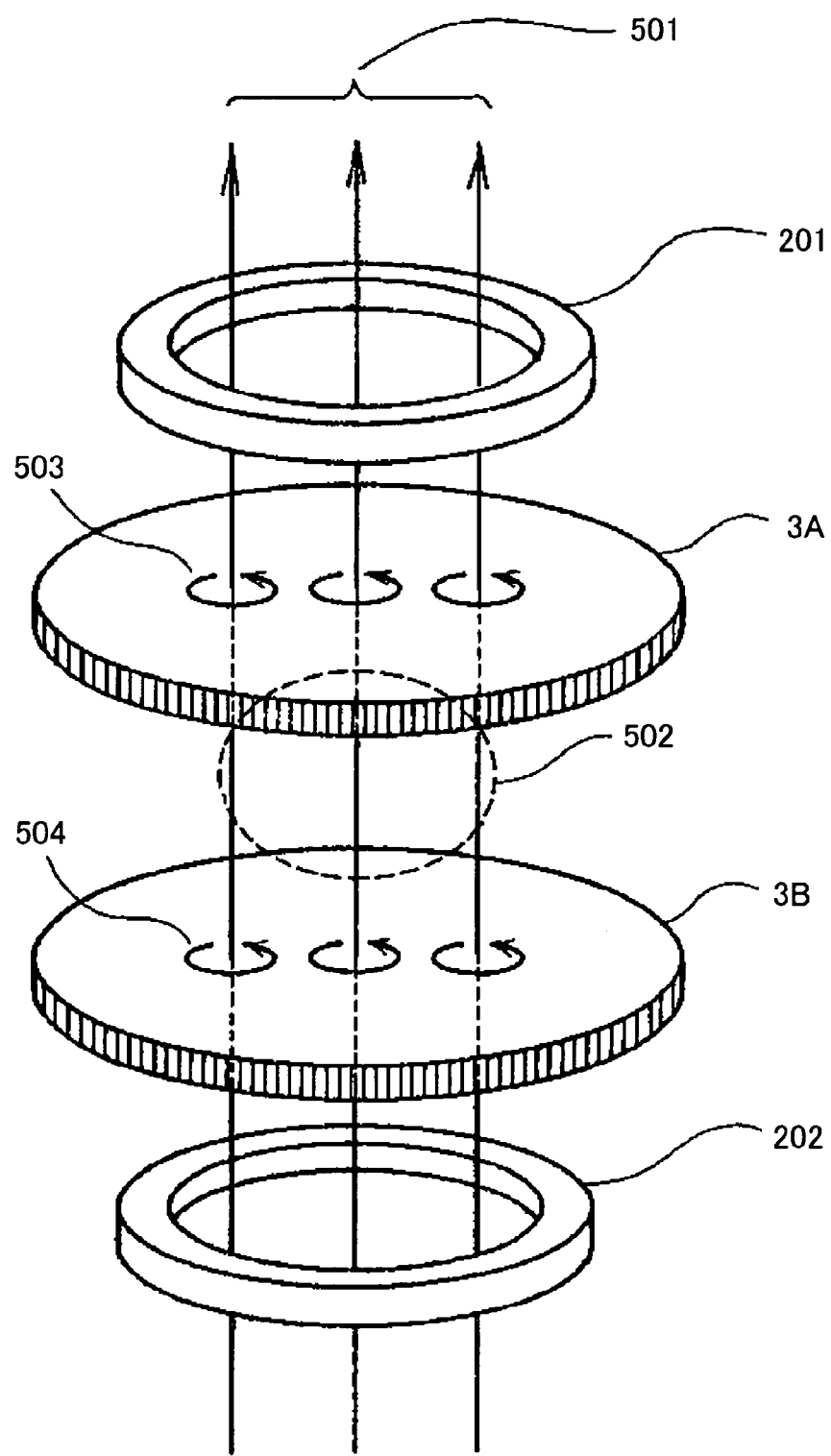
FIG. 5 is a diagram showing the operation of a magnetic field fluctuation reducing means according to the present invention.

FIG. 5 shows the principle on which the operation of the magnetic field fluctuation reducing plate 3 for canceling the fluctuations in the magnetic field. As shown in the figure, magnetic flux 501 (shown by arrows) generated by the upper superconductive coil 201 and the lower superconductive coil 202 passes through the magnetic field fluctuation reducing plates 3A and 3B, which are arranged close to the superconductive coils 201 and 202, respectively, so that a stable magnetic field with a 0.7-tesla magnetic field strength is generated in the imaging space 502 where the object is inserted. The magnetic field fluctuation reducing plates 3A and 3B have a size sufficiently larger than the diameter of the upper and lower superconductive coils 201 and 202 so as to surely trap this magnetic flux.

Figure 9:
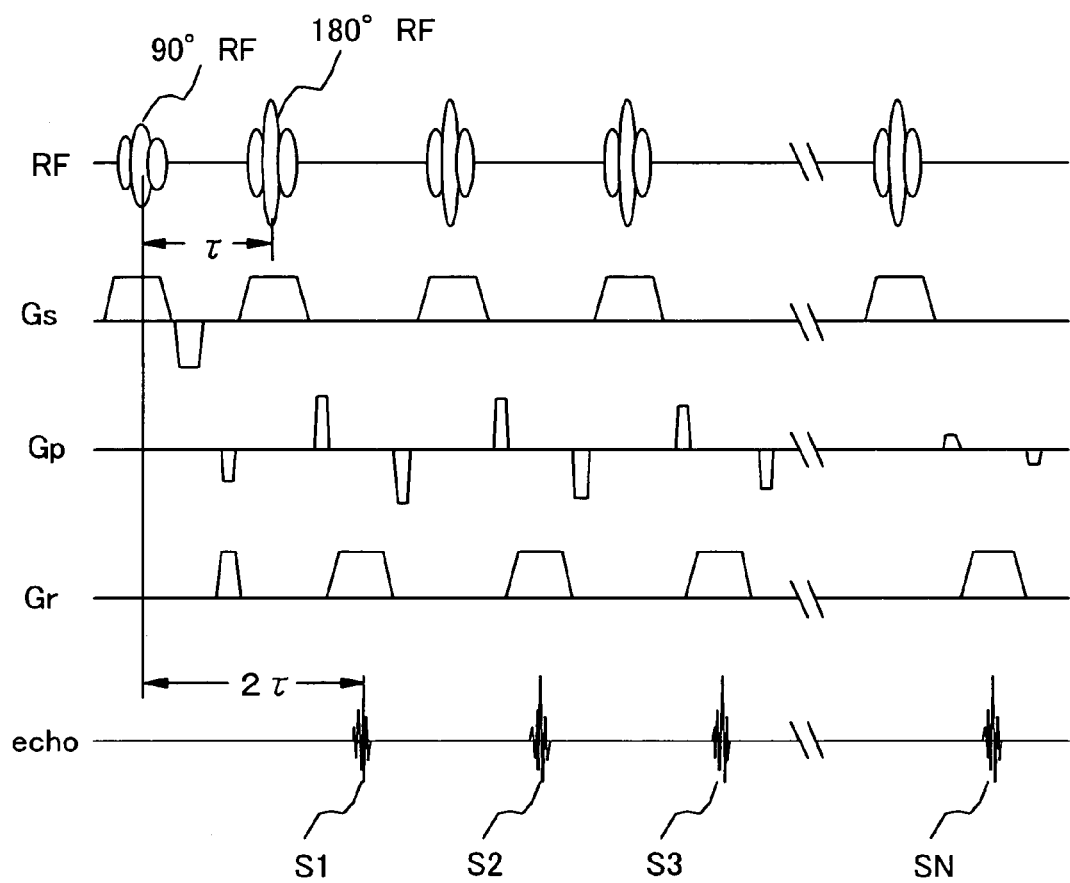
FIG. 9 is a chart showing a pulse sequence of a fast spin echo method.

Here, it is assumed that the imaging sequence of the fast spin echo method shown in FIG. 9 is employed. In the fast spin echo imaging sequence, first, current is supplied to a predetermined gradient magnetic field coil, among the gradient magnetic field coils on the x-, y-, and z-axes, from the magnetic field power source 15, and a slicing gradient magnetic field (Gs) is applied to the object 1, while a radio-frequency magnetic field (90° RF pulse) having a frequency band in accordance with the slicing position of the object is applied. Consequently, the nuclear spins at the slicing position of the object are excited. At a predetermined time period after this excitation, a readout gradient magnetic field (Gr) of a predetermined amount is applied, so as to dephase the excited nuclear spins. At a predetermined time (T) after the excitation, a radio-frequency magnetic field (180° RF pulse) and the slicing gradient magnetic field (Gs) are applied, thereby inverting the excited nuclear spins. By the application of the 180° RF pulse and the slicing gradient magnetic field, the nuclear spins at the slicing position of the object are inverted, and the dephased nuclear spins begin to be rephased. After applying the 180° RF pulse, a phase-encoding gradient magnetic field (Gp) is applied. Incidentally, the phase-encoding magnetic field might be applied as an offset value between the application of the 90° RF pulse and of the 180° RF pulse. The phase-encoding gradient magnetic field (Gp) provides, to the excited nuclear spins, positional information corresponding to the position of the nuclei in the phase-encoding direction. When the phase encoding is finished, a readout gradient magnetic field (Gr) is applied. During the application of the readout gradient magnetic field (Gr), an NMR signal S1 (first echo signal) is detected by the detecting coil 6. The echo signal S1, detected by the detecting coil 6, is sampled by an A/D converter in the radio-frequency amplification/detection circuit 17. The echo signal is provided with positional information in the readout direction at the time intervals of this sampling.

The echo signal S1 has its peak value after $\tau$ from the application of the 180° RF pulse, and after that its amplitude is attenuated due to dephasing of the nuclear spins. When the measurement of the first echo signal is completed in this manner, the readout gradient magnetic field (Gr) is turned off and a phase-encoding gradient magnetic field having an alternating polarity (−Gp) is applied. After $2\tau$ from the application of the 180° RF pulse, the 180° RF pulse is applied again with the slicing gradient magnetic field (Gs), and a second echo signal S2 is measured. The amount of the phase-encoding gradient magnetic field used in the measurement of the second echo signal is different from that of the first echo signal. In the same manner, measurement is performed on a third echo signal S3, a fourth echo signal, ..., and a nth echo signal SN. The thus-measured echo signal group is first stored in a memory area, which is referred to as a k space, it is two-dimensionally Fourier-transformed, and then it is displayed as an image on a display device.

An imaging sequence in which the number of echo signals for generating one MR image is measured with one application of a 90° RF pulse is referred to as the one-shot FSE (Fast Spin Echo) method, and an imaging sequence in which measurement is performed with several 90° RF pulse applications is referred to as the multi-shot FSE method. In the multi-shot FSE method, a pulse sequence is executed so that the number of echo signals needed for generating one image is measured repeatedly, where the time period of executing one pulse sequence is referred to as the time of repetition TR. Recently, in order to shorten the imaging time for the MR imaging, the time length of RF pulse application, the time length of gradient magnetic field application, and the TR tend to be shortened. Further, to shorten the measurement time, gradient magnetic fields having high strength tend to be applied in a short time.

In executing such imaging sequences, the gradient magnetic field coils generate gradient magnetic fields when the gradient magnetic field power source supplies current thereto. When the current is supplied pulsingly to the gradient magnetic field coils, an electromagnetic force is exerted on the coil conductor in proportion to the current strength. This electromagnetic force changes the position of the gradient magnetic field coils. Further, since the gradient magnetic fields are repeatedly applied at predetermined time intervals in executing the imaging sequence, the gradient magnetic field coils are vibrated with a predetermined frequency.

When the time interval between applications of the gradient magnetic field pulse is shortened, the time interval between application (that is, the application frequencies) of at least one of the gradient magnetic field pulses Gs, Gp, and Gr, which are imaging parameters, might coincide with the resonance frequencies of the cryostats 203 and 204, or those of the superconductive coils 201 and 202. Also, when at least two of the gradient magnetic field pulses Gs, Gp, and Gr are combined, the vibration frequency of the gradient magnetic field coils might coincide with the resonance frequencies of the cryostats 203 and 204 or those of the superconductive coils 201 and 202. Due to such vibration of the gradient magnetic field coils, the upper superconductive coil 201 and/or the lower superconductive coil 202 are/is resonated and their relative position changes. When the relative position of the superconductive coils 201 and 202 changes due to the vibration of the gradient magnetic field coils, the static magnetic field strength is fluctuated.

When the position of the upper superconductive coil 201 changes, for example, the distance between the upper superconductive coil 201 and the lower superconductive coil 202 changes and/or the upper and lower superconductive coils 201 and 202 shift in parallel to each other, the density of the magnetic flux 501 passing through the magnetic field fluctuation reducing plate 3A, (that is, passing through the imaging space 502) slightly changes. Due to this magnetic flux density change, the static magnetic field strength of the imaging space 502 also changes. Such a change in the static magnetic field strength appears as an artifact on the image.

In accordance with the invention, as shown in FIG. 5, good conductivity of the magnetic field fluctuation reducing plates 3 is actively utilized so as to generate eddy currents 503 and 504 in response to a density change of the magnetic flux 501.

That is, in response to a change where the density of the magnetic flux 501 decreases, the eddy current 503 flows in a direction such that it generates a magnetic flux which compensates for the decreased density of the magnetic flux 501; and, in response to a change where the density of the magnetic flux 501 increases, the eddy current is generated in the reverse direction. In this manner, when the density of the magnetic flux 501 changes, the magnetic field fluctuation reducing plates 3 constantly generate an eddy current for compensating for such change. Thus, a uniform magnetic field in the imaging space 502 is maintained at a stable magnetic field strength. Consequently, the fluctuation of the static magnetic field can be suppressed within a range where it does not affect the image (0.01 ppm or less, for example).

It should be understood that, according to the above-described principle, the magnetic field fluctuation reducing plates 3 according to the invention can respond not only to static magnetic field fluctuation due to the vibration of the gradient magnetic field generating means, but also to static magnetic field fluctuation due to other causes of vibration. Therefore, the MRI apparatus according to the invention responds not only to the vibration of the apparatus itself, for example, as generated by the gradient magnetic field generating means, but also to vibration generated, for example, by other apparatuses installed in the building where the MRI apparatus is installed.

Figure 6:
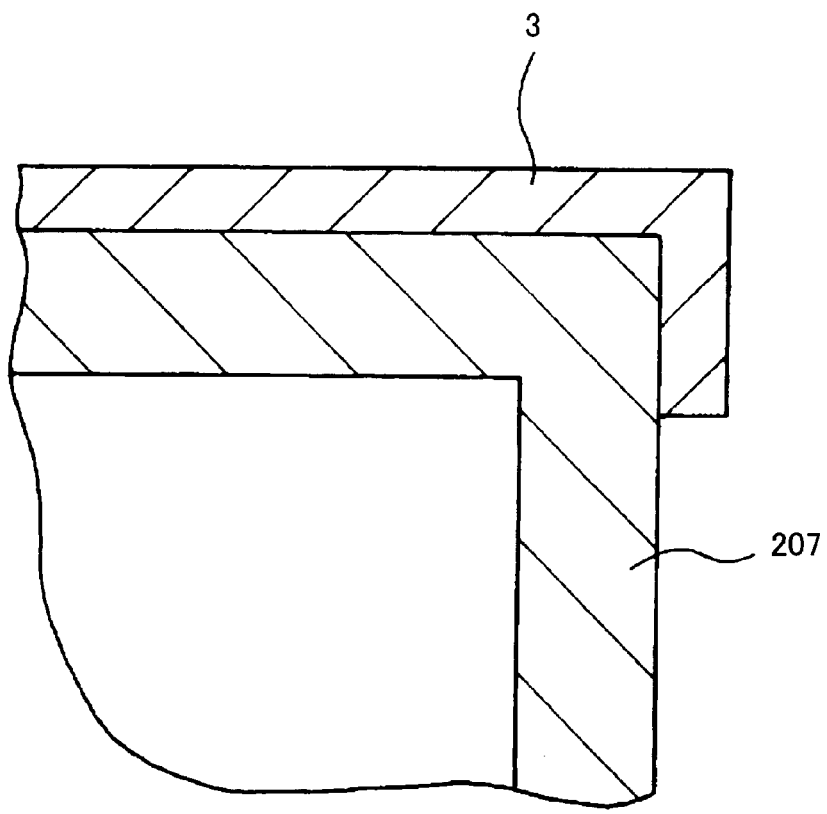
FIG. 6 is a diagram showing the main part of the MRI apparatus according to another embodiment of the present invention.
Figure 6:
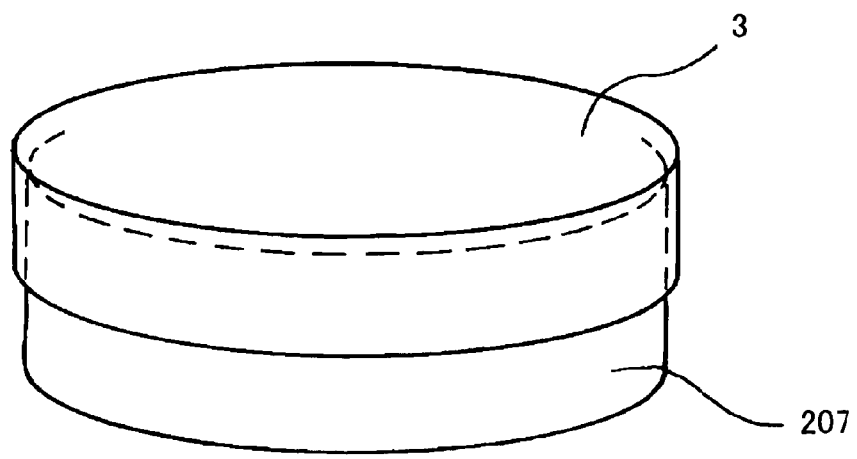

The foregoing description is directed to one embodiment of the MRI apparatus according to the present invention. However, the present invention can be modified in various ways. For example, the magnetic field fluctuation reducing plates 3 have a flat-plate shape in this embodiment. However, the magnetic field fluctuation reducing means may have any shape so long as a magnetic flux generated by a static magnetic field generating coil can be trapped. As shown in FIG. 6, the magnetic field fluctuation reducing plate 3 may have a vertical portion on its outer circumference so as to cover a part of the vacuum chamber 207 in the cryostat. Further, the surface of the cryostat of the static magnetic field generating device facing the imaging-space may have a concavo-convex surface or an oblique surface instead of a flat surface so as to contain gradient magnetic field coils. In such a case, the magnetic field fluctuation reducing plates may have a shape substantially conforming to that of the cryostat surface.

Figure 7:
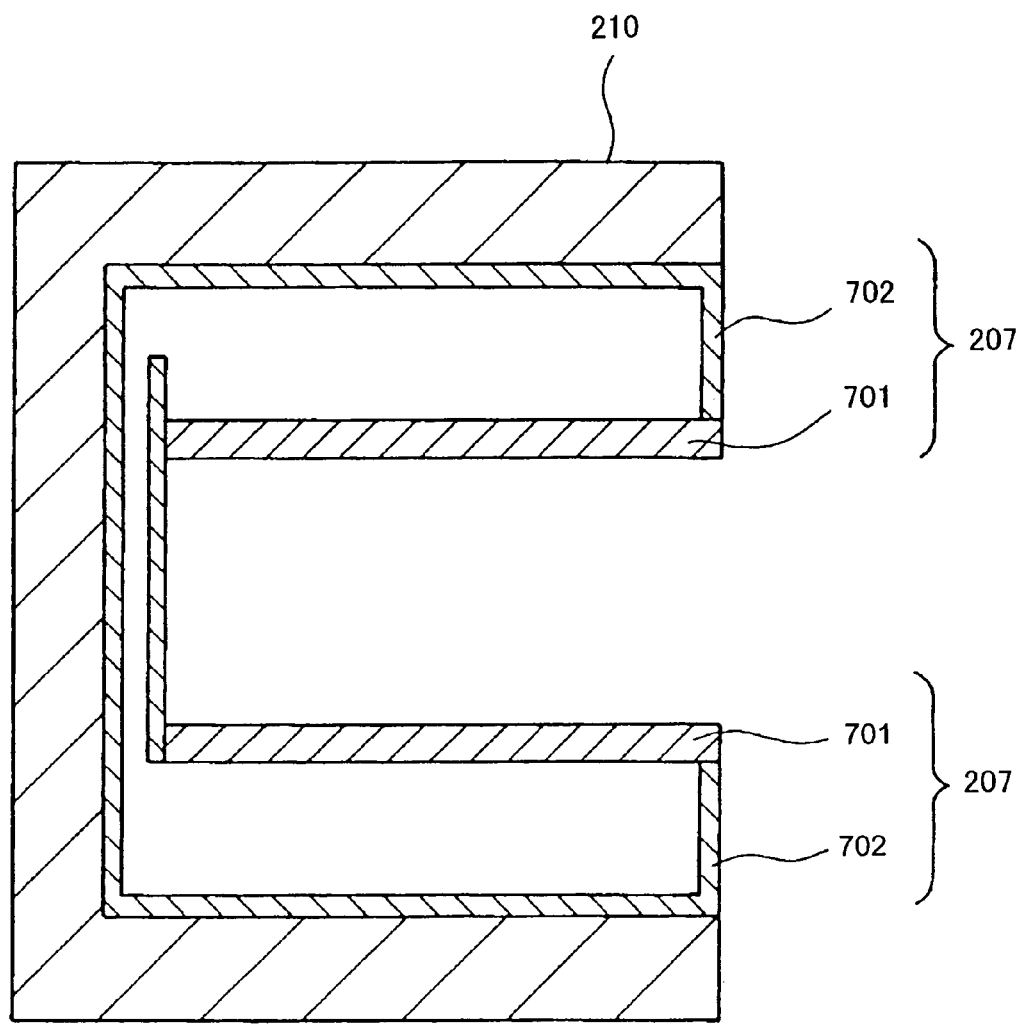
FIG. 7 is a diagram showing the main part of an MRI apparatus according to another embodiment of the present invention.

Further, in the above-described embodiment, the magnetic field fluctuation reducing plates 3 are fixed to the upper and lower cryostats 203 and 204 with bolts or the like. However, as shown in FIG. 7, a bottom surface 701 of the vacuum chamber 207 of the upper cryostat 203 and a top surface 701 of the vacuum chamber 207 of the lower cryostat 203 may be made of a material having the same effect as that of the magnetic field fluctuation reducing plates 3. In this embodiment, the portion 701 of the upper cryostat vacuum chamber facing the measurement space is made of pure aluminum and the other portion 702 of the upper cryostat vacuum chamber is made of stainless steel. The technique of joining aluminum with stainless steel is already known, by which the withstanding pressure characteristics necessary for the vacuum chamber 207 can be obtained.

According to this embodiment, the magnetic field fluctuation reducing means is constructed as a part of the vacuum chamber 207, that is, the circumference of the portion 701 is joined as a unit with a cylindrical portion 702. Consequently, the mechanical flexibility of the portion 701 in response to vibration is limited, as in the embodiment shown in FIG. 2. The embodiment includes an iron shield 210 as in the embodiment shown in FIG. 2 and arranged as illustrated. Further, the imaging space can be expanded by the size of the stainless member that has been eliminated steel, or the thickness of the stainless steel of the vacuum chamber 207 can be added to the thickness of the pure aluminum of the magnetic field fluctuation reducing means, whereby sufficient thickness of the magnetic field fluctuation reducing plates can be maintained. Therefore, the effectiveness of the magnetic field fluctuation reducing means can be improved.

Figure 8:
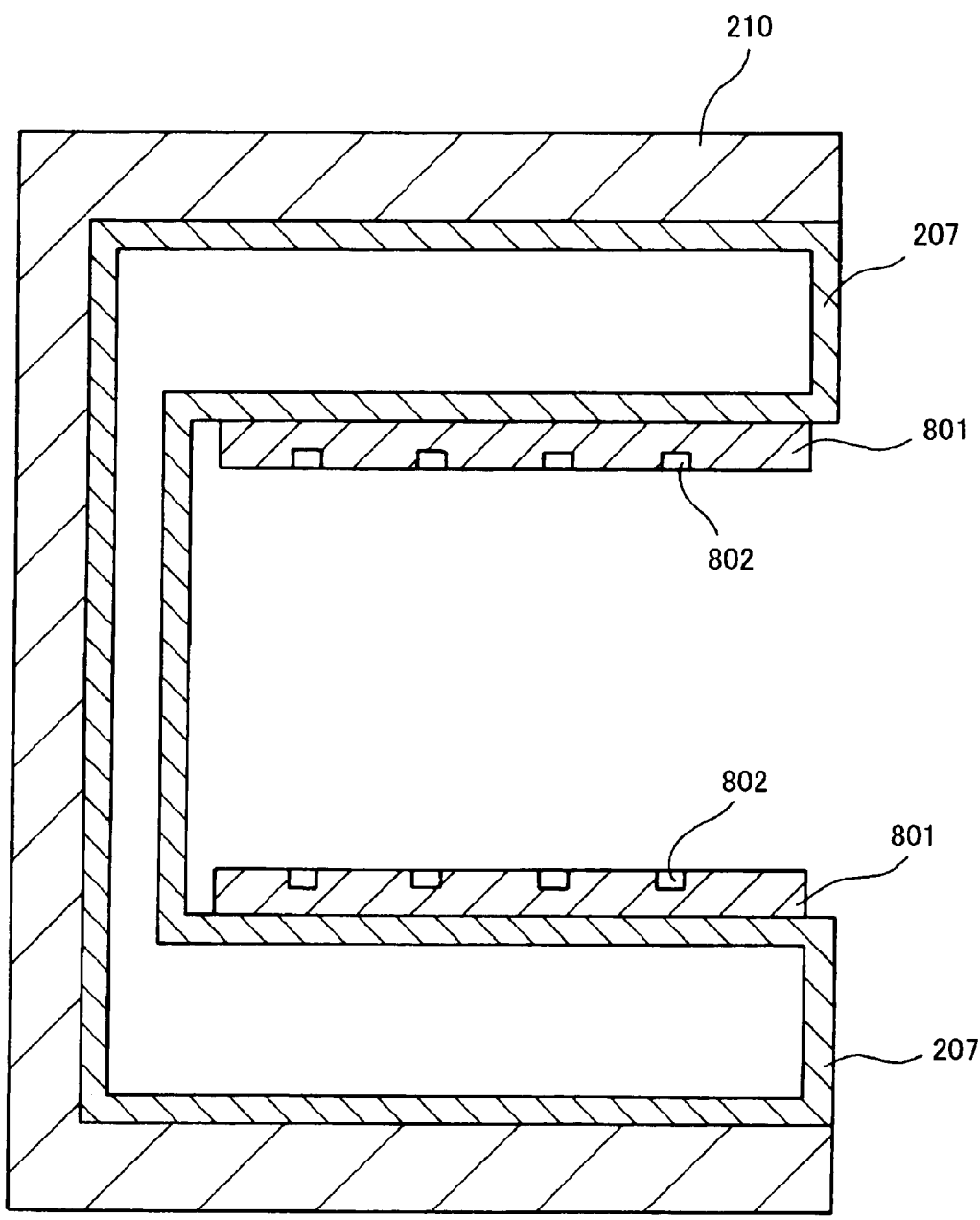
FIG. 8 is a diagram showing the main part of the MRI apparatus according to another embodiment of the present invention.

As another alternative embodiment of the invention, the magnetic field fluctuation reducing means may be provided with a plurality of ferromagnetic pieces for a passive-shimming mechanism, as shown in FIG. 8. Here, the magnetic field fluctuation reducing means is constituted of aluminum plates 801 fixed to the vacuum chamber 207, and the passive-shimming mechanism is formed of a plurality of ferromagnetic pieces 802 provided on one side of each aluminum plate, at least a part of which is mounted in the aluminum plate. Generally, to adjust the magnetic field uniformity in the imaging space to 3 ppm or less, for example, using a passive shimming mechanism, a large number of the ferromagnetic pieces 802 have to be provided. Consequently, in this embodiment a large number of concave holes and threaded holes are provided on the surface of each of the magnetic field fluctuation reducing plates 801 on the imaging space side, ferromagnetic pieces engaging with the threaded holes are screwed into necessary portions of the threaded holes, so that the ferromagnetic pieces are thus accommodated into the thickness of the magnetic field fluctuation reducing plates 801.

According to this embodiment, the ferromagnetic pieces 802 are inserted into the magnetic field fluctuation reducing plates 801, whereby the imaging space is not reduced, even though the magnetic field fluctuation reducing plates are inserted into an MRI apparatus employing a passive shimming mechanism. Incidentally, in this embodiment also, the magnetic field fluctuation reducing plates 801 may be fixed to the vacuum chamber 207 as shown in the figure, or a part of the vacuum chamber 207 may be formed of the magnetic field fluctuation reducing plates 801 and includes an iron shield 210, as in the embodiment shown in FIG. 7.

The present invention is applied to an MRI apparatus having structure where static magnetic field generating magnets are provided above and below the imaging space. However, the invention is not limited thereto, and it may employ different variations. For example, in the above-described embodiment, the magnetic field fluctuation reducing plates are provided to the magnets which oppose each other on either side of the imaging space; however, the same effect can be obtained even when a magnetic field fluctuation reducing plate is provided to only one of the magnets. Further, the invention may be applied to an MRI apparatus having a structure where the static magnetic field generating magnet is separated into two parts and is aligned in the body-axis direction of an object supported on a bed. Further, the invention may be applied not only to an MRI apparatus employing superconductive coils for the static magnetic field generating magnet, but also to an apparatus employing resistive coils or permanent magnets.

According to the invention, in an MRI apparatus using an open magnet for generating a high magnetic field, a stable magnetic strength can be obtained within a space where an object is inserted that is not affected by vibration. Consequently, highly accurate examination results can be acquired.

Further, according to the invention, an MRI apparatus does not require conventional mechanisms for detecting vibration and consequential magnetic field vibration and for generating a correcting magnetic field, and components of the magnetic field fluctuation due to vibration can be substantially canceled without the detection error and correction error due to such mechanisms.

What is claimed is:

1. A magnetic resonance imaging apparatus comprising:
    static magnetic field generating means for generating a static magnetic field with predetermined strength in an imaging space having a size sufficient in order to accommodate an object to be examined; and
    gradient magnetic field coils configured for generating magnetic field gradients in the imaging space, the magnetic resonance imaging apparatus further comprising:
        magnetic field fluctuation reducing means for generating a magnetic flux so as to substantially maintain a predetermined static magnetic field strength when the static magnetic field fluctuates as a result of vibration of components of the static magnetic field generating means, by utilizing that static magnetic field fluctuation itself, without applying energy from the outside.

2. A magnetic resonance imaging apparatus comprising:
    static magnetic field generating means for generating a static magnetic field with predetermined strength in an imaging space having a size sufficient in order to accommodate an object to be examined;
    gradient magnetic field coils configured for generating magnetic field gradients in the imaging space; and
    magnetic field fluctuation reducing means for substantially canceling fluctuation components of magnetic field strength generated by said static magnetic field generating means, including nonmagnetic conductive members configured for generating magnetic flux for substantially canceling the fluctuation of the static magnetic field strength, by utilizing that static magnetic field fluctuation itself, without applying energy from the outside.

3. A magnetic resonance imaging apparatus according to claim 2, wherein said static magnetic field generating means is constituted of a pair of static magnetic field sources arranged opposite to each other with respect to the imaging space, and said magnetic field fluctuation reducing means is provided close to at least one static magnetic field generating source.

4. A magnetic resonance imaging apparatus according to claim 2, wherein the material of said nonmagnetic conductive members is aluminum, copper, or silver.

5. A magnetic resonance imaging apparatus according to claim 2, wherein said nonmagnetic conductive members have a flat-plate shape and are arranged so as to cross the magnetic flux direction in the imaging space.

6. A magnetic resonance imaging apparatus according to claim 2, wherein said magnetic field fluctuation reducing means is provided between said static magnetic field generating means and said gradient magnetic field coils.

7. A magnetic resonance imaging apparatus according to claim 6, wherein a gap is retained between said magnetic field fluctuation reducing means and said gradient magnetic field coils.

8. A magnetic resonance imaging apparatus according to claim 3, wherein said magnetic field fluctuation reducing means is arranged close to both of the static magnetic field generating sources.

9. A magnetic resonance imaging apparatus according to claim 3, wherein said pair of static magnetic field generating sources is constituted of superconductive coils.

10. A magnetic resonance imaging apparatus according to claim 3, wherein said pair of static magnetic field generating sources is constituted of resistive coils.

11. A magnetic resonance imaging apparatus according to claim 3, wherein said magnetic field fluctuation reducing means are arranged close to the respective surfaces of each static magnetic field generating source facing the imaging space.

12. A magnetic resonance imaging apparatus according to claim 11, wherein said magnetic field fluctuation reducing means is in close contact with said static magnetic field generating means.

13. A magnetic resonance imaging apparatus according to claim 9, wherein said magnetic field fluctuation reducing means is contained in static magnetic field generating means as a part of constituent members thereof.

14. A magnetic resonance imaging apparatus according to claim 10, wherein said magnetic field fluctuation reducing means is contained in static magnetic field generating means as a part of constituent members thereof.

15. A magnetic resonance imaging apparatus according to claim 3, wherein said pair of static magnetic field generating sources is constituted of superconductive coils, and said nonmagnetic conductive members have a flat-plate shape with a size that can cover the imaging space and are arranged so as to cross the magnetic flux direction in the imaging space.

16. A static magnetic field generating device for an MRI apparatus according to claim 3, wherein said static magnetic field generating means has one of a concave-convex surface and an oblique surface on a side of the imaging space, and said nonmagnetic conductive members have a shape substantially conforming to a shape of the imaging space side surface of said static magnetic field generating means.

17. A magnetic resonance imaging apparatus comprising:
a pair of static magnetic field generating sources arranged opposite to each other with respect to an imaging space where an object to be examined is inserted;
a magnetic circuit member configured for leading magnetic flux generated by each of the said static magnetic field generating sources respectively to the other static magnetic field generating source, which magnetic circuit member is arranged outside the continuous space including said pair of static magnetic field sources and said imaging space;
nonmagnetic conductive plates provided close to respective surfaces of the respective static magnetic field generating sources facing the imaging space, and being configured for generating a compensating magnetic flux so as to substantially maintain a predetermined static magnetic field strength when a static magnetic field fluctuates as a result of vibration of components of the static magnetic field generating sources, by utilizing that static magnetic field fluctuation itself, without applying energy from the outside; and
a pair of gradient magnetic field coils supported and fixed to said magnetic circuit member by a supporting mechanism, and being arranged between the imaging space and said nonmagnetic conductive plates.

18. A magnetic resonance imaging apparatus according to claim 17, wherein said supporting mechanism has an adjusting mechanism for arranging each of said gradient magnetic field coils in parallel to surfaces of said static magnetic field generating sources.

19. A magnetic resonance imaging apparatus comprising:
a pair of static magnetic field generating sources arranged opposite to each other with respect to an imaging space where an object to be examined is inserted;
a magnetic circuit member configured for leading magnetic flux generated by each of said static magnetic field generating sources respectively to the other static magnetic field generating source, which magnetic circuit member is arranged outside the continuous space including said pair of static magnetic field generating sources and the imaging space;
nonmagnetic conductive plates provided close to surfaces of the respective static magnetic field generating sources facing the imaging space, and being configured for generating a compensating magnetic flux so as to substantially maintain a predetermined static magnetic field strength when the static magnetic field fluctuates as a result of vibration of components of the static magnetic field sources, by utilizing that static magnetic field fluctuation itself, without applying energy from the outside;
a pair of gradient magnetic field coils supported by and fixed to said magnetic circuit member and being arranged between the imaging space and said nonmagnetic conductive plates; and
a plurality of ferromagnetic pieces detachably provided on said nonmagnetic conductive plates configured for adjusting the magnetic field uniformity of the imaging space.

20. A magnetic resonance imaging apparatus according to claim 19, wherein said nonmagnetic conductive plates have a predetermined thickness, and a part of said ferromagnetic pieces are inserted in the thickness direction thereof.

21. A magnetic resonance imaging apparatus comprising:
static magnetic field generating means for generating a static magnetic field with a predetermined strength in an imaging space having a size sufficient in order to accommodate an object to be examined and
gradient magnetic field coils configured for generating magnetic field gradients in the space, the magnetic resonance imaging apparatus further comprising:

magnetic field fluctuation reducing means which is constituted of a conductive member in which eddy currents are induced in response to fluctuation of the static magnetic field strength as a result of vibration of components of said static magnetic field generating means, the eddy currents being induced by utilizing that static magnetic field fluctuation itself, without applying energy from the outside, which eddy currents in turn generate a magnetic flux compensating for the fluctuation of the static magnetic field strength; and means for correcting the effect given to gradient magnetic fields by the magnetic flux generated by said magnetic field fluctuation reducing means due to said eddy current.

22. A static magnetic field generating device for an MRI apparatus comprising:

static magnetic field generating means including a pair of coils configured for generating a static magnetic field with a predetermined strength in an imaging space, which coils are respectively contained in vessels and arranged above and below the imaging space;

a magnetic circuit member configured for leading magnetic flux generated by each of said coils respectively to the other coil, which magnetic circuit member is provided outside the area including the imaging space and said pair of vessels; and magnetic field fluctuation reducing means provided to the sides of respective vessels containing said coils facing the imaging space so as to cross the magnetic flux generated by said coils, the magnetic field fluctuation reducing means including nonmagnetic conductive plates configured for generating a compensating magnetic flux so as to compensate for fluctuation in the density of the magnetic flux when the magnetic flux density fluctuates, the compensating magnetic flux being generated by utilizing static magnetic field fluctuation itself, without applying energy from the outside.

23. A static magnetic field generating device for an MRI apparatus according to claim 22, wherein said coils are superconductive coils.

24. A static magnetic field generating device for an MRI apparatus according to claim 22, wherein said coils are resistive coils.

25. A static magnetic field generating device configured for an MRI apparatus according to claim 22, wherein said nonmagnetic conductive plates are made of aluminum, copper, or silver.

26. A static magnetic field generating device for an MRI apparatus comprising:

a static magnetic field generating means constituted of a pair of coils configured for generating a static magnetic field with a predetermined strength in an imaging space, which coils are respectively contained in vessels and arranged above and below the imaging space;

a magnetic circuit member configured for leading magnetic flux generated by each of said coils respectively to the other coil, which magnetic circuit member is arranged outside the area including the imaging space and said pair of vessels;

conductive plates provided close to the respective surfaces of each of the vessels containing said coils facing the imaging space so as to cross the magnetic flux generated by said coils, the conductive plates generating a compensating magnetic flux which substantially cancels out fluctuation of a magnetic flux density when the density of the magnetic flux fluctuates as a result of vibration of components of said static magnetic field generating means, the compensating magnetic flux being generated by utilizing static magnetic field fluctuation itself, without applying energy from the outside; and a plurality of ferromagnetic pieces configured for adjusting the uniformity of the magnetic field generated by said coils in the imaging space, a part of which is inserted into said conductive plates in the thickness direction of said conductive plates.

27. A static magnetic field generating device for an MRI apparatus according to claim 26, wherein said conductive plates are made of a nonmagnetic material.

* * * * *